United States Patent
Ayabe et al.

(10) Patent No.: US 10,668,494 B2
(45) Date of Patent: Jun. 2, 2020

(54) SUBSTRATE PROCESSING APPARATUS AND SUBSTRATE PROCESSING METHOD

(71) Applicant: Tokyo Electron Limited, Tokyo (JP)

(72) Inventors: Go Ayabe, Kumamoto (JP); Minoru Tashiro, Kumamoto (JP); Kunihiko Fujimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 195 days.

(21) Appl. No.: 15/710,017

(22) Filed: Sep. 20, 2017

(65) Prior Publication Data
US 2018/0085769 A1 Mar. 29, 2018

(30) Foreign Application Priority Data
Sep. 26, 2016 (JP) ................. 2016-187350

(51) Int. Cl.
| | |
|---|---|
| H01L 21/06 | (2006.01) |
| B05B 13/04 | (2006.01) |
| H01L 21/67 | (2006.01) |
| B05B 13/02 | (2006.01) |
| B05D 1/02 | (2006.01) |
| B05B 14/00 | (2018.01) |

(52) U.S. Cl.
CPC ...... *B05B 13/0405* (2013.01); *B05B 13/0228* (2013.01); *B05D 1/02* (2013.01); *H01L 21/06* (2013.01); *H01L 21/6708* (2013.01); *H01L 21/67051* (2013.01); *H01L 21/67253* (2013.01); *H01L 21/67259* (2013.01); *B05B 14/00* (2018.02)

(58) Field of Classification Search
None
See application file for complete search history.

(56) References Cited

U.S. PATENT DOCUMENTS 5,873,947 A * 2/1999 Mohindra ................. B08B 3/10
134/18

FOREIGN PATENT DOCUMENTS

| JP | 2005-86181 A | * | 3/2005 |
|---|---|---|---|
| JP | 2005-086181 A | | 3/2005 |

* cited by examiner

*Primary Examiner* — Michael E Barr
*Assistant Examiner* — Jason P Riggleman
(74) *Attorney, Agent, or Firm* — Abelman, Frayne & Schwab

(57) ABSTRACT

A substrate processing apparatus according to the present disclosure includes a holding unit, a nozzle, a driving unit, and a controller. The holding unit holds a substrate. The nozzle supplies a processing liquid to the substrate held on the holding unit. The driving unit moves the nozzle. The controller controls the driving unit, so as to move the nozzle while supplying the processing liquid to the substrate from the nozzle. Further, the controller controls the driving unit based on recipe information including step information including positions of first and second points above the substrate, total time for moving the nozzle between the first and second points, and a moving speed of the nozzle, so as to cause reciprocation of the nozzle.

10 Claims, 13 Drawing Sheets

FIG. 8

| START POSITION | END POSITION |
|---:|---:|
| −30 | 30 |
| 30 | −30 |
| −30 | 30 |
| 30 | −30 |
| ⋮ | ⋮ |
| −30 | −60 |
| −60 | 60 |
| 60 | −60 |
| −60 | 60 |
| 60 | −60 |
| −60 | 60 |
| ⋮ | ⋮ |

Prior Art

FIG. 9A
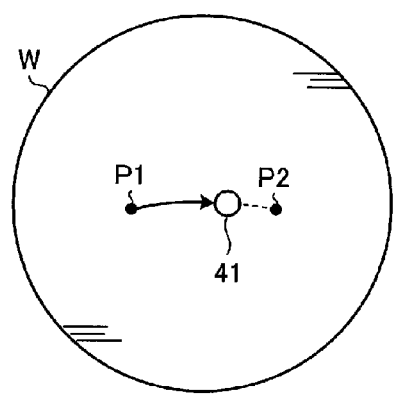
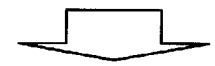
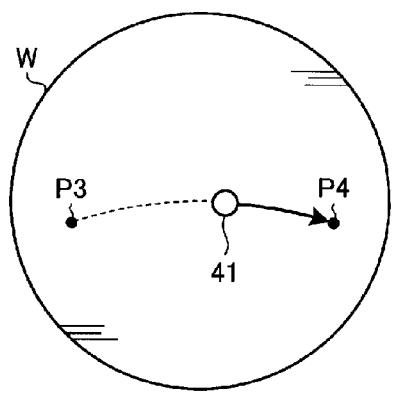

FIG. 9B
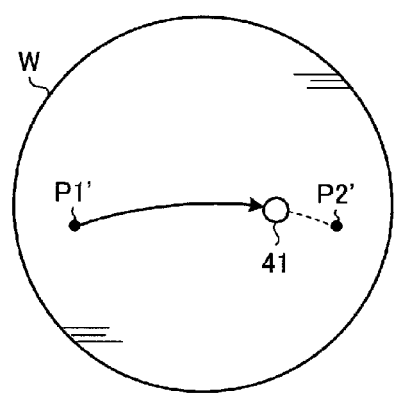
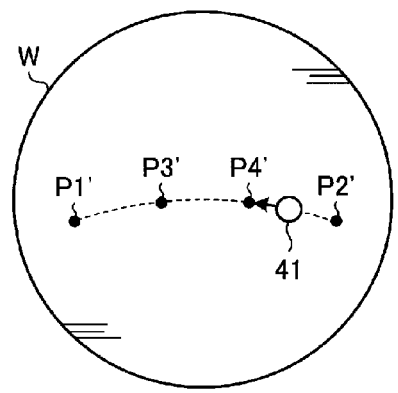

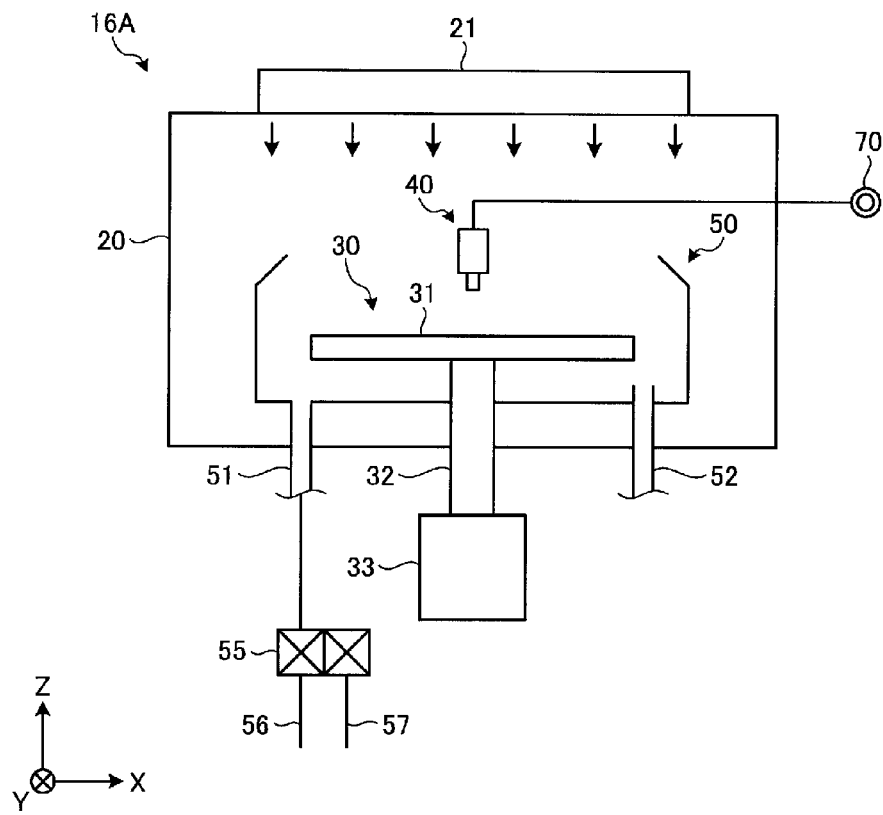

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2016-187350, filed on Sep. 26, 2016, with the Japan Patent Office, the disclosure of which is incorporated herein in its entirety by reference.

TECHNICAL FIELD

The present disclosure relates to a substrate processing apparatus and a substrate processing method.

BACKGROUND

In related art, a substrate processing apparatus has been known which processes a substrate (e.g., a semiconductor wafer or a glass substrate) by supplying a processing liquid to the substrate from a nozzle provided above the substrate.

In this substrate processing apparatus, an operation of moving the nozzle between two arbitrary points above a substrate (hereinafter, referred to as a "reciprocating operation") by oscillating an arm supporting the nozzle may be performed (see, e.g., Japanese Laid-Open Patent Publication No. 2005-086181).

The reciprocating operation is implemented by alternately inputting a forward route step and a backward route step. For example, when it is desired to move the nozzle between points A and B, an operator creates recipe information of the reciprocating operation by alternately inputting a step of moving the nozzle from the point A to the point B and a step of moving the nozzle from the point B to the point A.

SUMMARY

According to an aspect of an exemplary embodiment, a substrate processing apparatus includes a holding unit, a nozzle, a driving unit, and a controller. The holding unit holds a substrate. The nozzle supplies a processing liquid to the substrate held on the holding unit. The driving unit moves the nozzle. The controller controls the driving unit, so as to move the nozzle while supplying the processing liquid to the substrate from the nozzle. Further, the controller controls the driving unit based on recipe information including step information including positions of first and second points above the substrate, total time for moving the nozzle between the first and second points, and a moving speed of the nozzle, so as to cause reciprocation of the nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 8 is a view illustrating an example of recipe information of related art.

FIG. 9A is a view illustrating an example of a start position determining process.

FIG. 9B is a view illustrating an example of a start position determining process.

FIG. 12 is a schematic plan view illustrating a configuration of a processing unit according to a modification.

FIG. 13 is a view illustrating an example of recipe information according to a modification.

DETAILED DESCRIPTION

Figure 1:
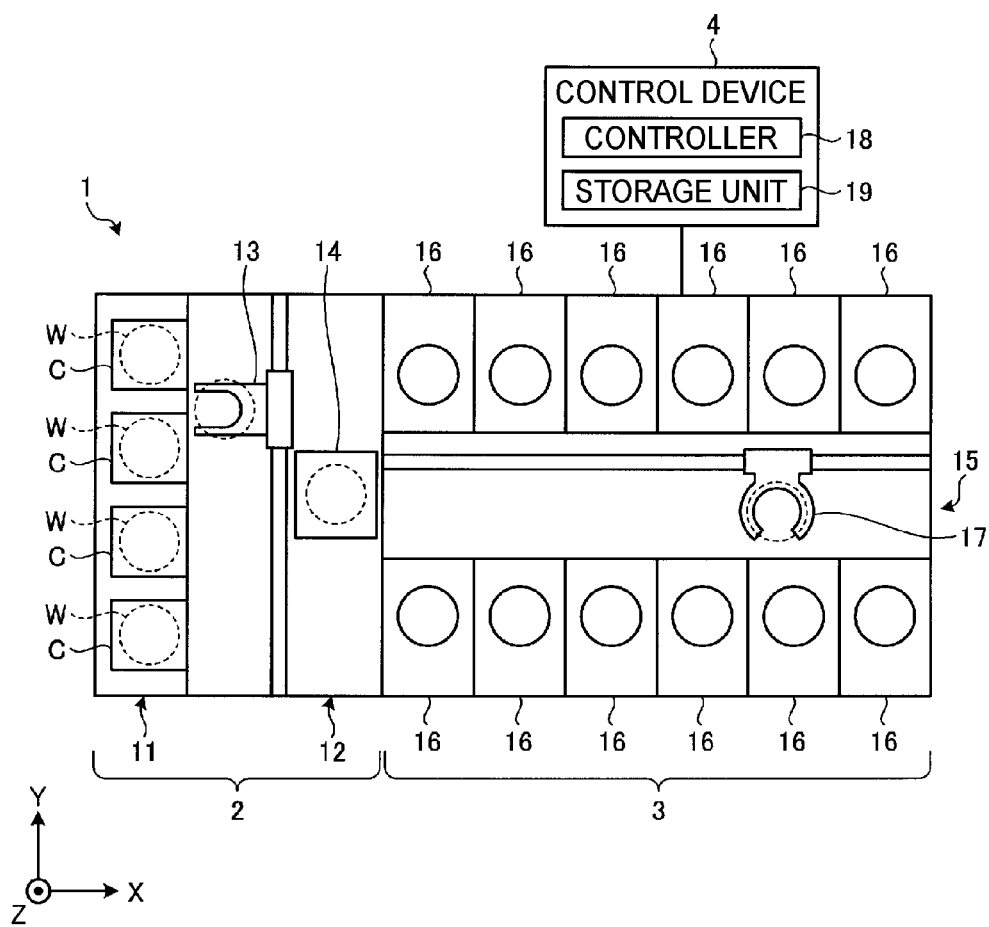
FIG. 1 is a view illustrating an outline of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the method of the related art that alternatively inputs the forward route step and the backward route step, there is a problem in that it takes time to create the recipe information.

An aspect of an exemplary embodiment provides a substrate processing apparatus and a substrate processing method in which time required to create recipe information may be reduced.

According to an aspect of an exemplary embodiment, a substrate processing apparatus includes a holding unit, a nozzle, a driving unit, and a controller. The holding unit holds a substrate. The nozzle supplies a processing liquid to the substrate held on the holding unit. The driving unit moves the nozzle. The controller controls the driving unit, so as to move the nozzle while supplying the processing liquid to the substrate from the nozzle. Further, the controller controls the driving unit based on recipe information including step information including positions of first and second points above the substrate, total time for moving the nozzle between the first and second points, and a moving speed of the nozzle, so as to cause reciprocation of the nozzle.

In the above-described substrate processing apparatus, the controller controls the driving unit based on the recipe information, so as to repeatedly perform a process of moving the nozzle from the first point to the second point at the moving speed, and a subsequent process of moving the nozzle from the second point to the first point at the moving speed, until the total time is reached.

In the above-described substrate processing apparatus, when the controller controls the driving unit based on recipe information including first step information including the positions of the first and second points, first total time for moving the nozzle between the first and second points, and a first moving speed of the nozzle, and third step information including a position of a fifth point above the substrate and processing liquid supply time at the fifth point, the processing liquid is continuously supplied to the substrate from the nozzle while the nozzle is moved from an end position of an operation based on the first step information to the fifth point.

In the above-described substrate processing apparatus, when the controller controls the driving unit based on recipe information including first step information including the positions of the first and second points, first total time for moving the nozzle between the first and second points, and a first moving speed of the nozzle, and second step information including positions of third and fourth points above the substrate, second total time for moving the nozzle between the third and fourth points, and a second moving speed of the nozzle, the processing liquid is continuously supplied to the substrate from the nozzle while the nozzle is moved from an end position of an operation based on the first step information to the third or fourth point.

In the above-described substrate processing apparatus, the controller moves the nozzle between the third and fourth points, for time obtained by subtracting time required to move the nozzle from the end position to the third or the fourth point, from the second total time.

In the above-described substrate processing apparatus, the controller includes: a measurement unit that measures time required to move the nozzle from the end position to the third or fourth point; and a subtraction unit that subtracts the time measured by the measurement unit from the second total time.

In the above-described substrate processing apparatus, the controller moves the nozzle at the second moving speed during time when the nozzle is moved from the end position to the third or fourth point.

In the above-described substrate processing apparatus, the controller further includes: a position detection unit that detects the end position; and a start position determination unit that determines one of the third and fourth points which is positioned at a front side in a movement direction of the nozzle, from the end position detected by the position detection unit, immediately before the operation based on the first step information is ended, as a start position of an operation based on the second step information.

In the above-described substrate processing apparatus, when the third and fourth points are not positioned at the front side in the movement direction of the nozzle, from the end position detected by the position detection unit, immediately before the operation based on the first step information is ended, the start position determination unit determines one of the third and fourth points which is close to the end position detected by the position detection unit, as the start position of the operation based on the second step information.

The above-described substrate processing apparatus further includes an operation unit that receives an input of the recipe information.

The above-described substrate processing apparatus further includes a reception unit that receives the recipe information via a network.

According to an aspect of an exemplary embodiment, a substrate processing method includes: holding a substrate; and controlling a driving unit configured to move a nozzle, so as to move the nozzle while supplying a processing liquid to the substrate from the nozzle, after the holding. The controlling controls the driving unit based on recipe information including step information including positions of first and second points above the substrate, total time for moving the nozzle between the first and second points, and a moving speed of the nozzle, so as to cause reciprocation of the nozzle.

According to an aspect of an exemplary embodiment, time required to create recipe information may be reduced.

Hereinafter, with reference to the accompanying drawings, exemplary embodiments of the substrate processing apparatus and the substrate processing method of the present disclosure will be described in detail. The present disclosure is not limited to the exemplary embodiments described hereinbelow.

FIG. 1 is a view illustrating an outline of a substrate processing system according to an exemplary embodiment of the present disclosure. In the following, in order to clarify positional relationships, the X-axis, the Y-axis, and the Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis. The substrate transfer device 13 transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then, places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
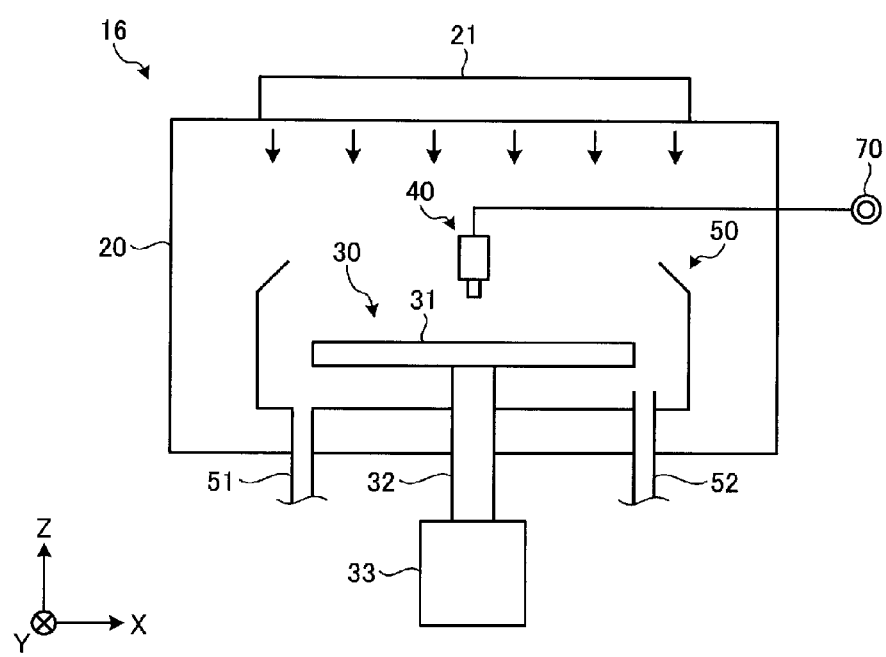
FIG. 2 is a schematic plan view illustrating a configuration of a processing unit.

Next, a schematic configuration of the processing unit 16 will be described with reference to FIG. 2. FIG. 2 is a schematic plan view illustrating the configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside of the processing unit 16.

Figure 3:
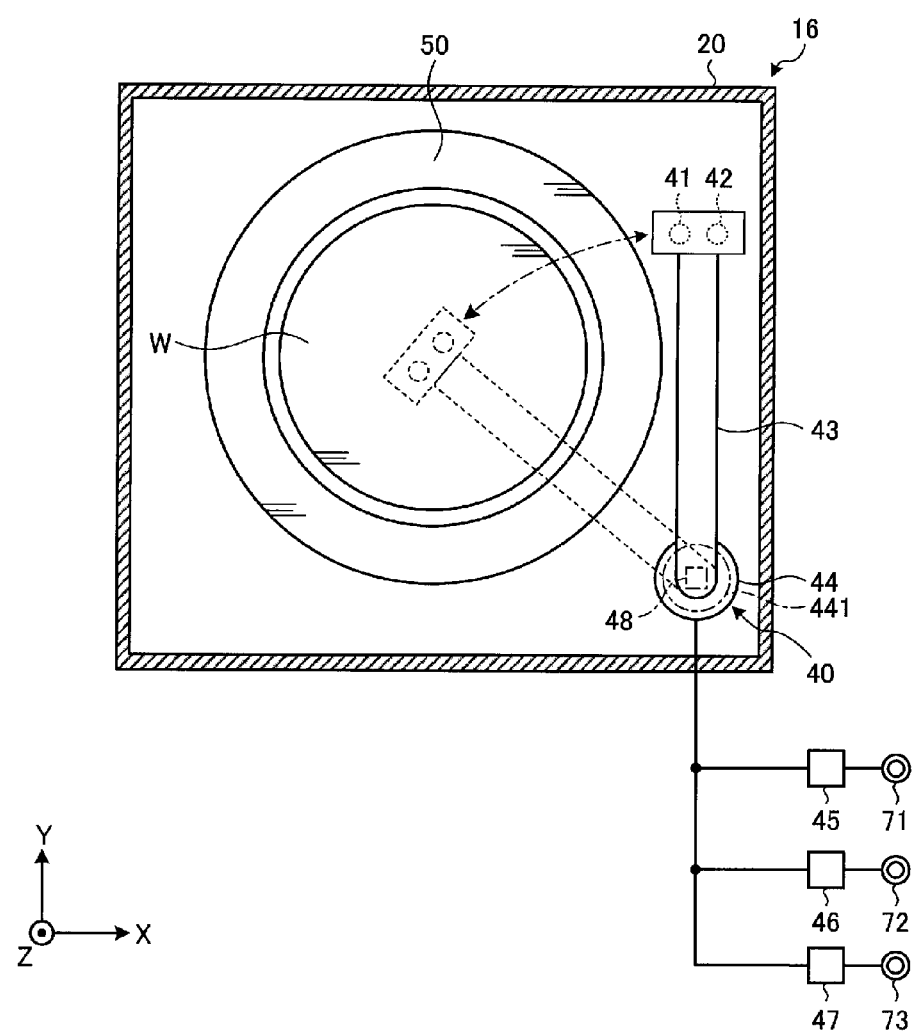
FIG. 3 is a schematic plan view of the processing unit.

Next, an exemplary configuration of the processing fluid supply unit 40 will be described with reference to FIG. 3. FIG. 3 is a schematic plan view of the processing unit 16.

As illustrated in FIG. 3, the processing fluid supply unit 40 includes a plurality of nozzles 41 and 42, a nozzle arm 43 that supports the plurality of nozzles 41 and 42 horizontally at the tip end thereof, and a pivoting mechanism 44 that pivots the nozzle arm 43. The pivoting mechanism 44 includes a driving unit 441 such as, for example, a motor for moving the nozzles 41 and 42.

Here, it is assumed that the processing fluid supply unit 40 includes the two nozzles 41 and 42. However, the number of the nozzles is not limited to that illustrated. For example, the nozzle arm 43 of the processing fluid supply unit 40 may support three or more nozzles or only one nozzle. In addition, here, it is assumed that the processing unit 16 includes one processing fluid supply unit 40. However, the processing unit 16 may include two or more processing fluid supply units 40.

The processing fluid supply unit 40 is connected to a first processing liquid supply source 71 via a flow rate regulation unit 45, connected to a second processing liquid supply source 72 via a flow rate regulation unit 46, and connected to a third processing liquid supply source 73 via a flow rate regulation unit 47. Each of the flow rate regulation units 45, 46, and 47 is configured to include, for example, a valve or a flow rate regulator. In the present exemplary embodiment, it is assumed that DIW (an example of a first processing liquid) supplied from the first processing liquid supply source 71 and DHF (an example of a second processing liquid) supplied from the second processing liquid supply source 72 are ejected from the nozzle 41. Further, in the present exemplary embodiment, it is assumed that IPA (an example of a third processing liquid) supplied from the third processing liquid supply source 73 is ejected from the nozzle 42. In addition, the DIW is an example of a rinse liquid, and each of the DHF and the IPA is an example of a chemical liquid.

Further, the processing unit 16 includes a position sensor 48. The position sensor 48 is, for example, an encoder and detects the rotation angle of the motor as the driving unit 441. The detection signal of the position sensor 48 is output to the controller 18 of the control device 4.

Figure 4:
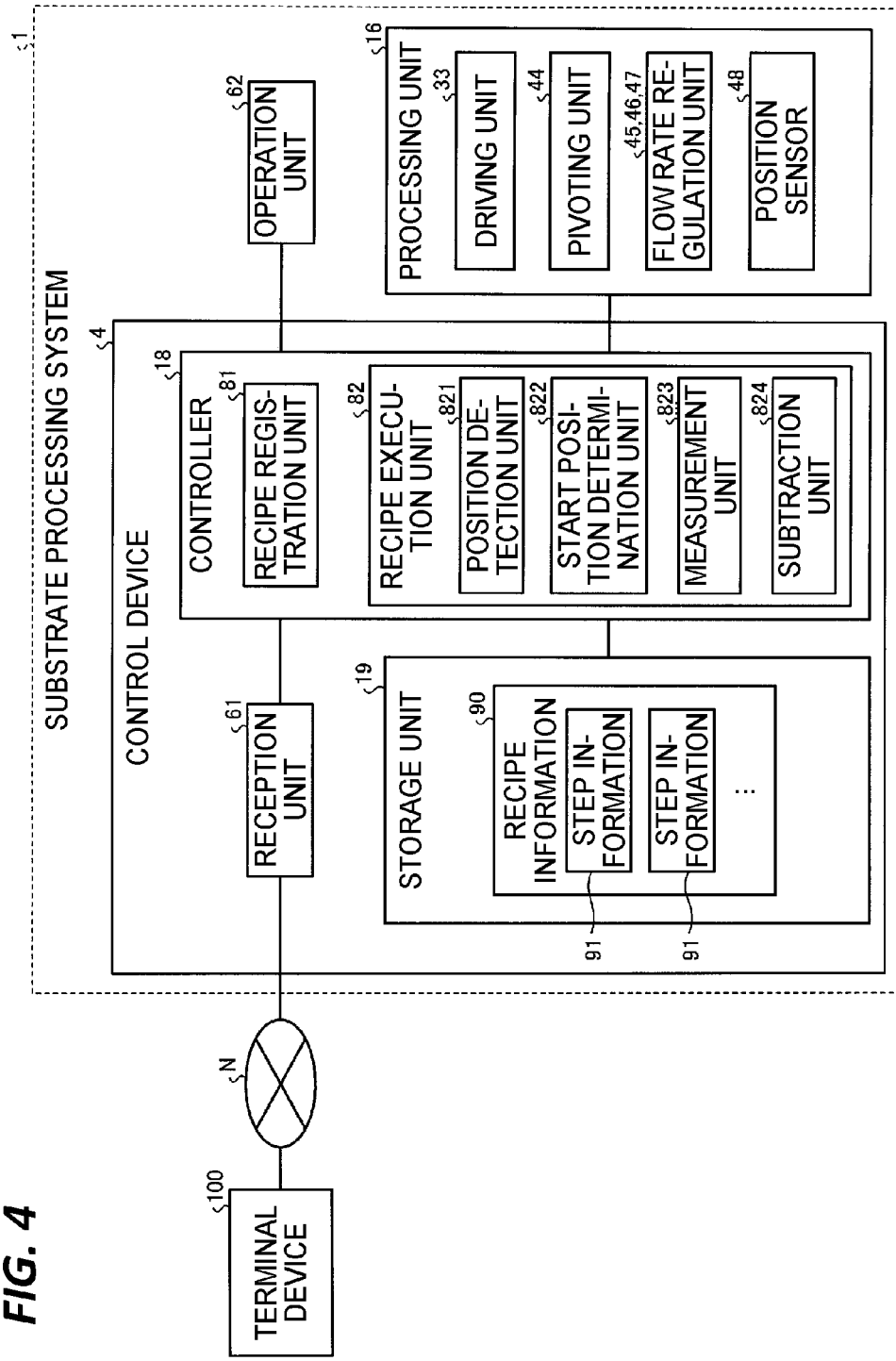
FIG. 4 is a block diagram illustrating an exemplary configuration of a control device.

Next, an exemplary configuration of the control device 4 will be described with reference to FIG. 4. FIG. 4 is a block diagram illustrating an exemplary configuration of the control device 4.

As illustrated in FIG. 4, the control device 4 is communicably connected to a terminal device 100 via a network N. The terminal device 100 is, for example, a personal computer (PC) and is provided separately from the substrate processing system 1. An operator inputs recipe information 90 by using an operation unit such as, for example, a touch panel display or a keyboard provided in the terminal device 100. The terminal device 100 transmits the input recipe information 90 to the control device 4 via the network N. In addition, the connection to the network N may be in the wireless or wired form.

The control device 4 includes a reception unit 61, a storage unit 19, and the controller 18. The reception unit 61 is a communication interface that receives the recipe information 90 transmitted from the terminal device 100 via the network N.

The storage unit 19 is implemented by, for example, a semiconductor memory element (e.g., a random access memory (RAM) or a flash memory) or a storage device (e.g., a hard disk or an optical disk). The storage unit 19 stores the recipe information 90. The recipe information 90 is a plan indicating contents of a substrate processing to be executed by the substrate processing system 1. The recipe information 90 includes a plurality of pieces of step information 91 indicating contents of respective processes of the substrate processing.

Figure 5:
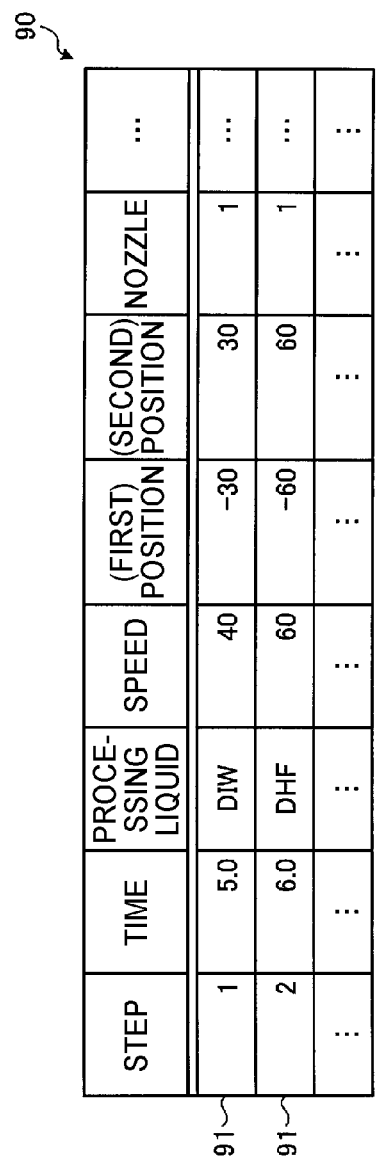
FIG. 5 is a view illustrating an example of recipe information.

Here, an example of the recipe information 90 will be described with reference to FIG. 5. FIG. 5 is a view illustrating an example of the recipe information 90.

As illustrated in FIG. 5, the recipe information 90 includes a plurality of pieces of step information 91, and each piece of step information 91 includes items such as, for example, "Step," "Time," "Processing Liquid," "Speed," "(First) Position," "(Second) Position," and "Nozzle."

The item "Step" stores information indicating a performance sequence of each process of the substrate processing. For example, the item "Step" illustrated in FIG. 5 stores "1" and "2." The number "1" indicates that the corresponding process is performed first, and the number "2" indicates that the corresponding process is performed after the process of the step "1."

The item "Time" stores information indicating processing time of each process. For example, the item "Time" illustrated in FIG. 5 stores "5.0" and "6.0." The times "5.0" and "6.0" indicate that the corresponding processes are performed for 5.0 sec and 6.0 sec, respectively.

The item "Processing Liquid" stores information indicating a processing liquid used in each process. For example, the item "Processing Liquid" illustrated in FIG. 5 stores "DIW" and "DHF." The "DIW" and the "DHF" indicate that "DIW" and "DHF" are used in the corresponding processes, respectively.

The item "Speed" stores information indicating the moving speed of the nozzles 41 and 42 in each process. For example, the item "Speed" illustrated in FIG. 5 stores "40" and "60." The speeds "40" and "60" indicate that the nozzles 41 and 42 are moved at 40 mm/sec and 60 mm/sec in the corresponding processes, respectively.

The items "(First) Position" and "(Second) Position" store distances (specifically, lengths) from the central position of the wafer W, as information indicating positions of the opposite ends of the range of the reciprocating operation to be described later. For example, the items "(First) Position" and the "(Second) Position" illustrated in FIG. 5 store "−30," "30," "−60," and "60." The distances "−30," "30," "−60," and "60" indicate that the distances from the central position of the wafer W are −30 mm, 30 mm, −60 mm, and 60 mm, respectively.

The item "Nozzle" stores information indicating a nozzle used in each process. For example, the item "Nozzle" illustrated in FIG. 5 stores "1." The number "1" indicates that the nozzle 41 is used in the corresponding process.

The controller 18 is implemented when various programs stored in a storage device inside the control device 4 are executed by, for example, a central processing unit (CPU) or a micro processing unit (MPU) using the RAM as a work area. Further, the controller 18 is implemented by an integrated circuit such as, for example, an application specific integrated circuit (ASIC) or a field programmable gate array (FPGA).

The controller 18 includes a recipe registration unit 81 and a recipe execution unit 82. The recipe execution unit 82 includes a position detection unit 821, a start position determination unit 822, a measurement unit 823, and a subtraction unit 824. In addition, the internal configuration of the controller 18 is not limited to the configuration illustrated in FIG. 4, and may be other configurations as long as the configurations perform the information processing to be described later.

The recipe registration unit 81 causes the storage unit 19 to store the recipe information 90 received from the terminal device 100 by the reception unit 61.

In addition, the recipe information 90 may also be input by using an operation unit 62 such as, for example, a touch panel display provided in the substrate processing system 1. The operation unit 62 receives the input of the recipe information 90. The recipe registration unit 81 also performs a process of causing the storage unit 19 to store the recipe information 90 input using the operation unit 62.

The recipe execution unit 82 causes the processing unit 16 to perform a predetermined substrate processing, by controlling the driving unit 33, the driving unit 441, the flow rate regulation units 45 to 47 and others of the processing unit 16 based on the recipe information 90 stored in the storage unit 19.

Specifically, based on the recipe information 90, the recipe execution unit 82 causes the processing unit 16 to perform an operation of moving the nozzles 41 and 42 between two preset points while supplying the processing liquid to the wafer W from the nozzle 41 or 42. More specifically, the recipe execution unit 82 causes the processing unit 16 to continuously perform a first reciprocating operation corresponding to the step "1" illustrated in FIG. 5 and a second reciprocating operation corresponding to the step "2" illustrated in FIG. 5.

Figure 6:
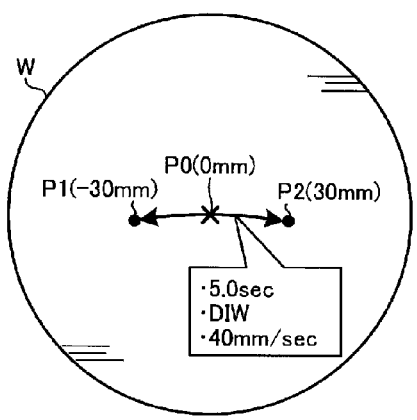
FIG. 6 is an explanatory view of a first reciprocating operation corresponding to STEP "1" illustrated in FIG. 5.

Here, an example of the first and second reciprocating operations will be described with reference to FIGS. 6 and 7. FIG. 6 is an explanatory view of the first reciprocating operation corresponding to the step "1" illustrated in FIG. 5, and FIG. 7 is an explanatory view of the second reciprocating operation corresponding to the step "2" illustrated in FIG. 5.

As illustrated in FIG. 6, the recipe execution unit 82 causes the processing unit 16 to perform the first reciprocating operation based on the step information 91 of the step "1" illustrated in FIG. 5. Specifically, the recipe execution unit 82 repeats a process of moving the nozzle 41 corresponding to the nozzle "1" from a first point P1 which is a position present −30 mm away from the central position P0 of the wafer W to a second point P2 which is a position present 30 mm away from the central position P0 of the wafer W at the moving speed of 40 mm/sec (an example of a first moving speed), and a subsequent process of moving the nozzle 41 from the second point P2 to the first point P1 at the moving speed of 40 mm/sec (an example of the first moving speed), for 5.0 seconds (an example of a first total time). During the processes, DIW is supplied from the nozzle 41 to the wafer W.

Figure 7:
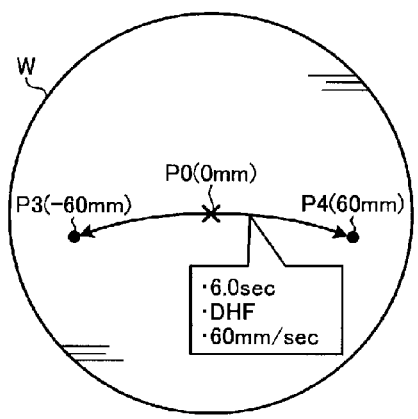
FIG. 7 is an explanatory view of a second reciprocating operation corresponding to STEP "2" illustrated in FIG. 5.

Further, as illustrated in FIG. 7, the recipe execution unit 82 causes the processing unit 16 to perform the second reciprocating operation subsequent to the above-described first reciprocating operation, based on the step information 91 of the step "2" illustrated in FIG. 5. Specifically, the recipe execution unit 82 repeats a process of moving the nozzle 41 corresponding to the nozzle "1" from a third point P3 which is a position present −60 mm away from the central position P0 of the wafer W to a fourth point P4 which is a position present 60 mm away from the central position P0 of the wafer W at the moving speed of 60 mm/sec (an example of a second moving speed), and a process of moving the nozzle 41 from the fourth point P4 to the third point P3 at the speed of 60 mm/sec (an example of the second moving speed), for 6.0 seconds (an example of a second total time). During the processes, DHF is supplied from the nozzle 41 to the wafer W.

As described above, the controller 18 according to the present exemplary embodiment controls the driving unit 441 based on the recipe information 90 including the step information 91 including the positions of the two arbitrary points (the items "(First) Position" and "(Second) Position") above the wafer W, the total time (the item "Time") for moving the nozzle 41 between the two points, and the moving speed (the item "Speed") of the nozzle 41, so as to cause the reciprocation of the nozzles 41 and 42. Thus, by the substrate processing system 1 according to the present exemplary embodiment, the time required to create the recipe information may be reduced.

This point will be described by comparison with a method of setting the reciprocating operation in the related art. FIG. 8 is a view illustrating an example of recipe information of the related art.

In the related art, the setting of the reciprocating operation is performed by alternatively inputting the forward route step and the backward route step. That is, for example, when a nozzle is caused to perform the above-described first reciprocating operation, the operator alternatively inputs a step of moving the nozzle from the first point P1 (−30 mm) as the start position to the second point P2 (30 mm) as the end position, and a step of moving the nozzle from the second point P2 as the start position to the first point P1 as the end position, as illustrated in FIG. 8.

Further, when the nozzle is caused to perform the second reciprocating operation subsequent to the first reciprocating operation, the operator first inputs a step of moving the nozzle from the end position of the first reciprocating operation (e.g., the first point P1) to the third point P3 (−60 mm) as the start position of the second reciprocating operation. Then, the operator alternatively inputs a step of moving the nozzle from the third point P3 (−60 mm) as the start position to the fourth point P4 (60 mm) as the end position, and a step of moving the nozzle from the fourth point P4 as the start position to the third point P3 as the end position.

As described above, in the related art, the recipe information is created by alternately inputting the step of moving the nozzle in one direction and the step of moving the nozzle in the opposite direction. Then, the reciprocation operation is implemented by causing the processing unit to repeat the operation of moving the nozzle in one direction and the operation of moving the nozzle in the opposite direction, based on the recipe information. Thus, there is a problem in that it takes time to create the recipe information.

Meanwhile, in the substrate processing system 1 according to the present exemplary embodiment, as described above, the processing unit 16 is caused to perform the reciprocating operation based on the recipe information 90 including the step information 91 including the positions of the two arbitrary points above the wafer W, the total time for moving the nozzles 41 and 42 between the two points, and the moving speed of the nozzles 41 and 42. Thus, in the substrate processing system 1 according to the present exemplary embodiment, the time for alternatively inputting the forward route step and the backward route step may be omitted. That is, the time required to set the reciprocating operation may be reduced. Therefore, by the substrate processing system 1 according to the present exemplary embodiment, the time required to create the recipe information may be reduced.

Referring back to FIG. 4, a specific exemplary configuration of the recipe execution unit 82 will be described. The position detection unit 821 detects the position of the nozzle 41 or 42 based on the detection signal input from the position sensor 48 of the processing unit 16. The position detection unit 821 delivers the detected position information of the nozzle 41 or 42 to the start position determination unit 822.

The start position determination unit 822 determines the start position of the second reciprocating operation according to the position of the nozzle 41 at the time when the first reciprocating operation is ended.

The contents of the start position determining process will be described with reference to FIGS. 9A and 9B. FIGS. 9A and 9B are views illustrating an example of the start position determining process.

The reciprocating operation according to the present exemplary embodiment is ended at a time point when the time included in the step information 91 elapses. Thus, the nozzle 41 may not be necessarily stopped at the positions of the opposite ends of the reciprocating movement range, and for example, may be stopped during the reciprocating movement as illustrated in the upper view of FIG. 9A.

When the first reciprocating operation is ended, the start position determination unit 822 acquires the position information of the nozzle 41 from the position detection unit 821. This position information indicates the end position of the first reciprocating operation. Then, when any of the "(First) Position" and the "(Second) Position" of the step information 91 corresponding to the second reciprocating operation is present at the front side in the movement direction of the nozzle 41 immediately before the first reciprocating operation is ended, the start position determination unit 822 determines the "position" present at the front side in the movement direction as the start position of the second reciprocating operation.

Meanwhile, when the "(First) Position" and the "(Second) Position" of the step information 91 are not present at the front side in the movement direction of the nozzle 41 immediately before the first reciprocating operation is ended, the start position determination unit 822 determines one of the "(First) Position" and the "(Second) Position" which is close to the nozzle 41, as the start position of the second reciprocating operation.

For example, as illustrated in the upper view of FIG. 9A, it is assumed that the first reciprocating operation is ended during the movement of the nozzle 41 from the first point P1 to the second point P2. As illustrated in the lower view of FIG. 9A, the fourth point P4 is present at the front side in the movement direction of the nozzle 41, from the end position of the first reciprocating operation, immediately before the first reciprocating operation is ended. In this case, the start position determination unit 822 determines the fourth point P4 of the third and fourth points P3 and P4 as the start position of the second reciprocating operation.

As described above, in the substrate processing system 1 according to the present exemplary embodiment, the position detection unit 821 detects the end position of the first reciprocating operation (an example of the operation based on the first step information), and the start position determination unit 822 determines one of the third and fourth points P3 and P4 which is present at the front side in the movement direction of the nozzle 41, from the end position detected by the position detection unit 821, immediately before the first reciprocating operation is ended, as the start position of the second reciprocating operation (an example of the operation based on the second step information).

Thus, the time for inputting the step of moving the nozzle from the end position of the first reciprocating operation to the start position of the second reciprocating operation, especially, the time for calculating the end position of the first reciprocating operation from the time, the speed, and the range of the first reciprocating operation and inputting the end position may be reduced.

Further, the nozzle 41 may be smoothly moved to the start position of the subsequent operation without being temporarily stopped.

Meanwhile, as illustrated in the upper view of FIG. 9B, it is assumed that the first reciprocating operation is ended during the movement of the nozzle 41 from a first point P1' to a second point P2'. As illustrated in the lower view of FIG. 9B, it is assumed that third and fourth points P3' and P4' are not present at the front side in the movement direction of the nozzle 41, from the end position of the first reciprocating operation, immediately before the first reciprocating operation is ended. In this case, the start position determination unit 822 determines the fourth point P4' of the third and fourth points P3' and P4' which is close to the end position of the first reciprocating operation, as the start position of the second reciprocating operation.

As described above, in the substrate processing system 1 according to the present exemplary embodiment, when the third and fourth points P3' and P4' are not present at the front side in the movement direction of the nozzle 41, from the end position detected by the position detection unit 821, immediately before the first reciprocating operation is ended, the start position determination unit 822 determines one of the third and fourth points P3' and P4' which is close to the end position detected by the position detection unit 821, as the start position of the second reciprocating operation.

Thus, the second reciprocating operation may be started earlier after the first reciprocating operation is ended.

Referring back to FIG. 4, the measurement unit 823 will be described. The measurement unit 823 measures the time until the nozzle 41 is moved from the end position of the first reciprocating operation to the start position of the second reciprocating operation.

The subtraction unit 824 subtracts the time measured by the measurement unit 823 from the "Time" included in the step information 91 corresponding to the second reciprocating operation.

Figure 10:
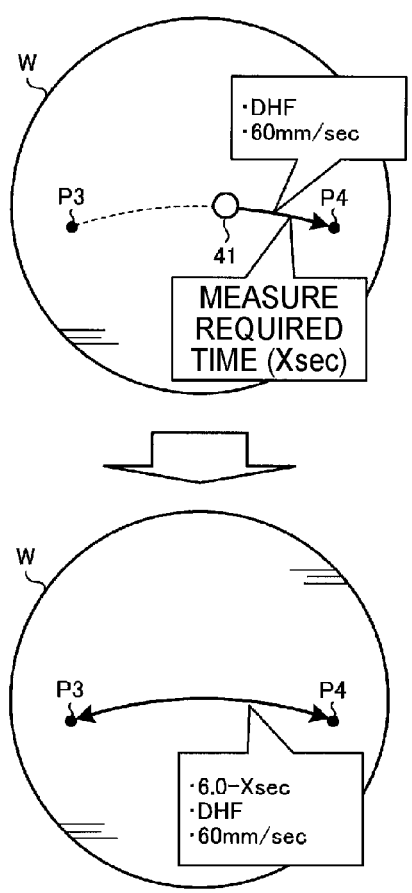
FIG. 10 is a view illustrating an example of a measuring process and a subtracting process.

Here, an example of the measuring process by the measurement unit 823 and the subtracting process by the subtraction unit 824 will be described with reference to FIG. 10. FIG. 10 is a view illustrating an example of the measuring process and the subtracting process.

As illustrated in the upper view of FIG. 10, when the nozzle 41 is moved from the end position of the first reciprocating operation to the start position of the second reciprocating operation (the fourth point P4 in this case), the recipe execution unit 82 moves the nozzle 41 at the moving speed (60 mm/sec) for the second reciprocating operation while supplying the processing liquid (DHF in this case) used in the second reciprocating operation from the nozzle 41 to the wafer W. In this way, by continuously supplying the processing liquid to the wafer W even during the movement from the end position of the first reciprocating operation to the start position of the second reciprocating operation, for example, an occurrence of watermarks due to the exposure of the surface of the wafer W may be suppressed.

However, in this case, the DHF may be supplied to the wafer W in an amount equal to or more than a supply amount determined by the recipe information 90, and as a result, the wafer W may be excessively processed.

Thus, in the substrate processing system 1 according to the present exemplary embodiment, the measurement unit 823 measures the time until the nozzle 41 is moved from the end position of the first reciprocating operation to the start position of the second reciprocating operation, and the subtraction unit 824 subtracts the time measured by the measurement unit 823 from the "Time" included in the second step information.

For example, as illustrated in the upper view of FIG. 10, it is assumed that it takes X seconds for the nozzle 41 to is moved from the end position of the first reciprocating operation to the start position of the second reciprocating operation. In this case, the subtraction unit 824 subtracts the time "X seconds" measured by the measurement unit 823 from the time "6.0 seconds" included in the second step information. Then, the recipe execution unit 82 causes the nozzle 41 to perform the second reciprocating operation for "6.0-X seconds."

As described above, in the substrate processing system 1 according to the present exemplary embodiment, the nozzle 41 is moved between the third and fourth points P3 and P4 for the time obtained by subtracting the time required to move the nozzle 41 from the end position of the first reciprocating operation to the start position of the second reciprocating operation (the third point P3 or the fourth point P4) from the time (the second total time) included in the second step information for the reciprocation of the nozzle 41. Thus, the wafer W may be suppressed from being excessively processed with the DHF.

The time required until the nozzle 41 is moved from the end position of the first reciprocating operation to the start position of the second reciprocating operation may be calculated in advance from the recipe information 90. However, in the method of calculating the required time in advance, it is difficult to obtain accurate required time due to, for example, an error caused from individual differences among the plurality of processing units 16 or an error caused from the repetition accuracy in one processing unit 16. Thus, in the substrate processing system 1 according to the present exemplary embodiment, the time measured by the measurement unit 823, that is, the actually measured value is subtracted from the "Time" included in the second step information. Thus, more accurate required time than that in the method of calculating the required time in advance may be obtained, so that the wafer W may be more reliably suppressed from being excessively processed.

Figure 11:
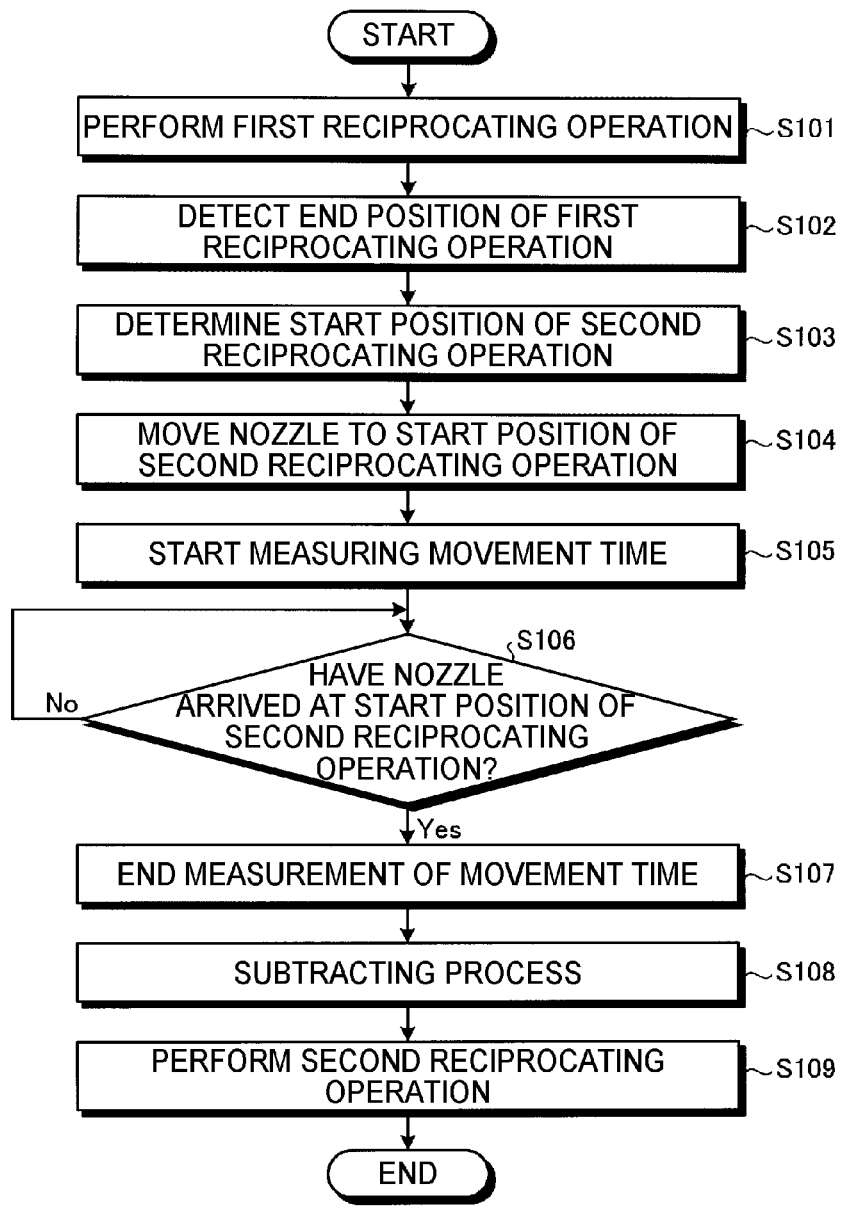
FIG. 11 is a flowchart illustrating process procedures executed by the substrate processing system.

Next, the specific operation of the substrate processing system 1 according to the present exemplary embodiment will be described with reference to FIG. 11. FIG. 11 is a flowchart illustrating an example of process procedures performed by the substrate processing system 1. Further, FIG. 11 illustrates process procedures until the second reciprocating operation is ended.

As illustrated in FIG. 11, the controller 18 causes the processing unit 16 to perform the first reciprocating operation based on the recipe information 90 (step S101). Specifically, after causing the wafer W to be held on the substrate holding mechanism 30, the controller 18 controls the driving unit 33 to rotate the wafer W. Thereafter, the controller 18 controls the pivoting mechanism 44 to move the nozzle 41 to, for example, the first point P1. Then, the controller 18 controls the pivoting mechanism 44 and the flow rate regulation unit 45 to supply DIW from the nozzle 41 to the wafer W for 5.0 seconds while moving the nozzle 41 between the first and second points P1 and P2 at the speed of 40 mm/sec.

When the first reciprocating operation is ended, the controller 18 detects the end position of the first reciprocating operation (step S102), and determines the start position of the second reciprocating operation based on the detected end position (step S103).

Subsequently, the controller 18 controls the driving unit 441 to move the nozzle 41 to the start position of the second reciprocating operation (step S104). At this time, the controller 18 moves the nozzle 41 at the moving speed of 60 mm/sec used in the second reciprocating operation while supplying the DHF used in the second reciprocating operation from the nozzle 41. Further, the controller 18 starts measuring the time until the nozzle 41 is moved from the end position of the first reciprocating operation to the start position of the second reciprocating operation (step S105).

Subsequently, the controller 18 determines whether the nozzle 41 has arrived at the start position of the second reciprocating operation (step S106). The controller 18 repeats the determining process of step S106 until the nozzle 41 arrives at the start position of the second reciprocating operation (No in step S106). When it is determined that the nozzle 41 has arrived at the start position of the second reciprocating operation (Yes in step S106), the controller 18 ends the measurement of the time until the nozzle 41 is moved from the end position of the first reciprocating operation to the start position of the second reciprocating operation (step S107).

Subsequently, the controller 18 performs the subtracting process of subtracting the time measured by the measurement unit 823 from the "Time" included in the second step information (step S108), and then, causes the processing unit 16 to perform the second reciprocating operation (step S109). Specifically, the controller 18 controls the driving unit 441 and the flow rate regulation unit 46 to supply the DHF from the nozzle 41 to the wafer W while moving the nozzle 41 between the third and fourth points P3 and P4 at the speed of 60 mm/sec. At this time, the controller 18 moves the nozzle 41 for the time obtained by the subtracting process in step S108.

As described above, the substrate processing system 1 (an example of the substrate processing apparatus) according to the present exemplary embodiment includes the holding unit 31, the nozzles 41 and 42, the driving unit 441, and the controller 18. The holding unit 31 holds a wafer W (an example of a substrate). The nozzles 41 and 42 supply the processing liquid to the wafer W held on the holding unit 31. The driving unit 441 moves the nozzles 41 and 42. The controller 18 controls the driving unit 441 to move the nozzles 41 and 42 while supplying the processing liquid from the nozzles 41 and 42 to the wafer W. Further, the controller 18 controls the driving unit 441 based on the recipe information 90 including the step information 91 including the positions of the first and second points P1 and P2 above the wafer W, the total time for moving the nozzles 41 and 42 between the first and second points P1 and P2, and the moving speed of the nozzles 41 and 42, so as to cause the reciprocation of the nozzles 41 and 42.

Thus, by the substrate processing system 1 according to the present exemplary embodiment, the time required to set the recipe information may be reduced, as compared to the setting method of alternatively inputting the forward route step and the backward route step in the related art.

Next, a modification of the substrate processing system 1 according to the present exemplary embodiment will be described with reference to FIGS. 12 and 13. FIG. 12 is a schematic plant view illustrating a configuration of a processing unit according to the modification. FIG. 13 is a view illustrating an example of recipe information according to the modification.

As illustrated in FIG. 12, a processing unit 16A according to the modification includes a switching unit 55. Under the control by the controller 18, the switching unit 55 switches the discharge destination of the used processing liquid from a disposal path 56 to a recovery path 57 or from the recovery path 57 to the disposal path 56. In addition, the processing unit 16A is brought into the operation standby state, during the time when the discharge destination is switched. That is, the controller 18 causes the processing unit 16A to perform the subsequent process after the switch from the disposal path 56 to the recovery path 57 or from the recovery path 57 to the disposal path 56 is completed.

In addition, as illustrated in FIG. 13, recipe information 90A stored in the storage unit 19 of the control device 4 further includes the item "Switched. Destination." The item "Switched Destination" stores information indicating the discharge destination of the processing liquid used in each process. Here, it is assumed that the switched destination "1" indicates the disposal path 56, and the switched destination "2" indicates the recovery path 57. That is, it is assumed that the DM used in the first reciprocating process is discharged to the disposal path 56, and the DHF used in the second reciprocating process is discharged to the recovery path 57.

Figure 14:
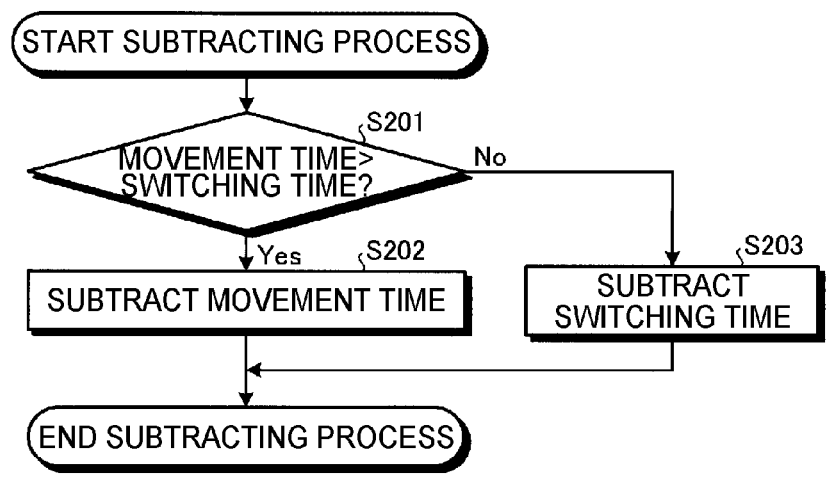
FIG. 14 is a flowchart illustrating process procedures of a subtracting process according to a modification.

Next, an example of a subtracting process according to the modification will be described with reference to FIG. 14. FIG. 14 is a flowchart illustrating an example of process procedures of the subtracting process according to the modification.

As illustrated in FIG. 14, the controller 18 determines whether the movement time of the nozzle 41 that has been measured by the processes of steps S105 to S107 illustrated in FIG. 11 is longer than the switching time required for the switching unit 55 to switch the discharge destination from the disposal path 56 to the recovery path 57 (step S201.). In addition, while the information of the switching time is stored in advance in the storage unit 19, for example, the switching time may be measured based on a result of measurement by flowmeters installed in the disposal path 56 and the recovery path 57.

When it is determined in step S201 that the movement time is longer than the switching time (Yes in step S201), the controller 18 subtracts the movement time measured by a measurement unit 823 from the "Time" included in the second step information as in step S108 illustrated in FIG. 11 (step S202). Meanwhile, when it is determined in step S201 that the movement time is not longer than the switching time (No in step S201), the controller 18 subtracts the switching time from the "Time" of the step information 91 corresponding to the second reciprocating operation (step S203). When step S202 or S203 is ended, the controller 18 ends the subtracting process.

As described above, the controller 18 may compare the movement time and the switching time with each other, and subtract the longer one of the times from the "Time" of the step information 91 corresponding to the second reciprocating operation.

Here, while the time required for the operation of switching the discharge destination of the used processing liquid is described as an example of the switching time, the switching time is not limited thereto. For example, the switching time may be any switching time required for a switching operation by mechanical driving such as, for example, a cup switching operation to switch the discharge destination of the processing liquid by controlling a lift mechanism that moves up and down one recovery cup when the processing unit 16 includes a multistage type recovery cup, or an exhaust switching operation to switch an exhaust path by controlling a switching unit that switches an exhaust path when the processing unit 16 includes a plurality of exhaust paths.

In the above-described exemplary embodiment, the example where DIW as a rinse liquid is supplied in the first reciprocating operation, and DHF as a chemical liquid is supplied in the second reciprocating operation has been described. However, the combination of the processing liquids in the first and second reciprocating operations is not limited to the example. For example, a first chemical liquid may be supplied in the first reciprocating operation, and then, a second chemical liquid may be supplied in the second reciprocating operation, or the chemical liquid may be supplied in the first reciprocating operation, and then, the rinse liquid may be supplied in the second reciprocating operation. In addition, the first and second chemical liquids may be the same. Further, the rinse liquid may be supplied in both the first and second reciprocating operations.

In the above-described exemplary embodiment, descriptions have been made on the example where the positions (the first and second points P1 and P2) of the opposite ends of the range of the reciprocating movement in the first reciprocating operation are different from the positions (the third and fourth points P3 and P4) of the opposite ends of the range of the reciprocating movement in the second reciprocating operation. However, the positions of the opposite ends of the range of the reciprocating movement in the first reciprocating operation and the positions of the opposite ends of the reciprocating movement in the second reciprocating operation may be the same.

In the above-described exemplary embodiment, the example where the second reciprocating operation is performed after the first reciprocating operation has been described. However, third and fourth reciprocating operations may be performed after the second reciprocating operation.

In the above-described exemplary embodiment, the example where the driving unit 441 pivots and moves the nozzles 41 and 42 has been described. However, the driving unit may straightly move the nozzles 41 and 42.

In the above-described exemplary embodiment, the example where the second reciprocating operation is performed after the first reciprocating operation has been described. However, the operation performed after the first reciprocating operation may not be necessarily the reciprocating operation. For example, the operation of supplying the processing liquid to the wafer W from the nozzle 41 may be performed in a state where the nozzle 41 is stopped at an arbitrary position above the wafer W (hereinafter, referred to as "stop/supply operation") after the first reciprocating operation.

Step information (third step information) of the stop/supply operation may include the position (a fifth point) where the nozzle 41 is stopped and the supply time of the processing liquid.

In this case as well, the recipe execution unit 82 may continuously supply the processing liquid to the wafer W from the nozzle 41 while the nozzle 41 is moved from the end position of the first reciprocating operation to the fifth point. Thus, for example, the occurrence of watermarks due to the exposure of the surface of the wafer W may be suppressed.

Further, the recipe execution unit 82 may supply the processing liquid to the wafer W from the nozzle 41, for time obtained by subtracting the time required to move the nozzle 41 from the end position of the first reciprocating operation to the fifth point as the start position of the stop/supply operation from the "Supply Time" included in the third step information, after positioning the nozzle 41 at the fifth point. Thus, the wafer W may be suppressed from being excessively processed with the processing liquid. In addition, as in the above-described exemplary embodiment, a value actually measured by the measurement unit 823 may be used as the time required to move the nozzle 41 from the end position of the first reciprocating operation to the fifth point as the start position of the stop/supply operation.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a holder that holds a substrate;
a nozzle that supplies a processing liquid to the substrate held by the holder;
a motor that moves the nozzle; and
a controller programmed to control the motor, so as to move the nozzle while supplying the processing liquid to the substrate from the nozzle,
wherein the controller is programmed to:
move the nozzle from a first position above the substrate to a second position above the substrate at a first moving speed;
move the nozzle from the second position back to the first position at the first moving speed thereby performing a reciprocating operation of the nozzle between the first position and the second position;
stop a movement of the nozzle during the reciprocation operation at an end position;
detect a location of the end position;
determine a location of a third position above the substrate and a fourth position above the substrate relative to the end position; and
move the nozzle from the end position to one of the third position or the fourth position, and
wherein a time to perform the reciprocating operation is a predetermined first total time.

2. The substrate processing apparatus of claim 1, wherein the controller is further programmed to continuously supply the processing liquid to the substrate from the nozzle while the nozzle is moved from the end position to the one of the third position or the fourth position.

3. The substrate processing apparatus of claim 2, wherein when the nozzle is moved to the one of the third position or the fourth position, the controller is further programmed to move the nozzle to the other of the third position or the fourth position at a second moving speed, and
wherein a time to move the nozzle from the end position to the one of the third position or the fourth position and then to the other of the third position or the fourth position is a predetermined second total time.

4. The substrate processing apparatus of claim 3, wherein the controller is further programmed to:
measure a time required to move the nozzle from the end position to the one of the third position or the fourth position; and
subtract the measured time from the second total time to obtain a time for moving the nozzle from the one of the third position or fourth position to the other of the third position or the fourth position.

5. The substrate processing apparatus of claim 3, wherein the controller is further programmed to move the nozzle at the second moving speed when the nozzle is moved from the end position to the one of the third position or the fourth position.

6. The substrate processing apparatus of claim 2, wherein the controller is further programmed to:
determine which one of the third position or the fourth position is positioned at a front side in a movement direction of the nozzle from the end position; and move the nozzle from the end position to the determined one of the third position or the fourth position positioned at the front side in the movement direction of the nozzle.

7. The substrate processing apparatus of claim 6, wherein when the third position and the fourth position are not positioned at the front side in the movement direction of the nozzle from the end position, the controller is further programmed to:
- determine which one of the third position and the fourth position is closest to the end position; and
- move the nozzle from the end position to the determined one of the third position or the fourth position closest to the end position.

8. The substrate processing apparatus of claim 1, wherein the controller is programmed to receive an input of information including the location of the first position, the location of the second position, the first moving speed, and the first total time from a user interface.

9. The substrate processing apparatus of claim 1 wherein the controller is programmed to receive information including the location of the first position, the location of the second position, the first moving speed, and the first total time via a network.

10. A substrate processing method comprising:
- holding a substrate;
- controlling a motor configured to move a nozzle, so as to move the nozzle while supplying a processing liquid to the substrate from the nozzle, after the holding;
- moving the nozzle from a first position above the substrate to a second position above the substrate at a first moving speed;
- moving the nozzle from the second position to the first position at the first moving speed thereby reciprocating the nozzle between the first position and the second position;
- stopping a movement of the nozzle during the reciprocating at an end position;
- detecting a location of the end position;
- determining a location of a third position above the substrate and a fourth position above the substrate relative to the end position; and
- moving the nozzle from the end position to one of the third position or the fourth position at a second moving speed,
- wherein a time to perform the reciprocating is a predetermined first total time.

* * * * *